(12) United States Patent
Bruno

(10) Patent No.: US 7,447,603 B2
(45) Date of Patent: Nov. 4, 2008

(54) POWER METER

(75) Inventor: David A. Bruno, Portland, OR (US)

(73) Assignee: Veris Industries, LLC, Portland, OR (US)

( * ) Notice: Subject to any disclaimer, the term of this patent is extended or adjusted under 35 U.S.C. 154(b) by 417 days.

(21) Appl. No.: 11/298,205

(22) Filed: Dec. 8, 2005

(65) Prior Publication Data

US 2006/0129339 A1 Jun. 15, 2006

Related U.S. Application Data

(60) Provisional application No. 60/635,594, filed on Dec. 13, 2004.

(51) Int. Cl.
*G06F 19/00* (2006.01)
(52) U.S. Cl. .......................... 702/64; 702/57

(58) Field of Classification Search ................... 361/73, 361/75, 659; 702/57, 64; 324/76.13, 76.15, 324/76.16, 76.38, 76.42, 76.43, 76.44, 76.45, 324/76.46, 76.49, 76.53, 76.54, 76.56, 76.57, 324/76.58, 76.59, 76.61, 76.62, 76.63, 76.64, 324/76.65, 76.66, 76.67, 76.69, 76.71, 76.72, 324/76.73, 76.74, 76.75, 76.76, 76.77, 76.78, 324/76.79, 76.81, 141
See application file for complete search history.

(56) References Cited

U.S. PATENT DOCUMENTS 6,044,430 A * 3/2000 MacDonald ................ 710/260
6,615,147 B1 * 9/2003 Jonker et al. ................ 702/61

FOREIGN PATENT DOCUMENTS

EP 1531334 A2 * 5/2005

* cited by examiner

*Primary Examiner*—John E. Barlow
*Assistant Examiner*—Douglas N Washburn
(74) *Attorney, Agent, or Firm*—Chernoff, Vilhauer, McClung & Stenzel

(57) ABSTRACT

The computational resources of a digital power meter can be reduced by utilizing an interrupt requested in anticipation of interrupt latency to perform real-time tasks, an approximation of a root mean square load current at an earlier time to compensate for a phase shift between the load current and the current transducer output, and an amplitude that is neither zero nor maximum to distinguish the cycles of a harmonically distorted waveform.

34 Claims, 10 Drawing Sheets

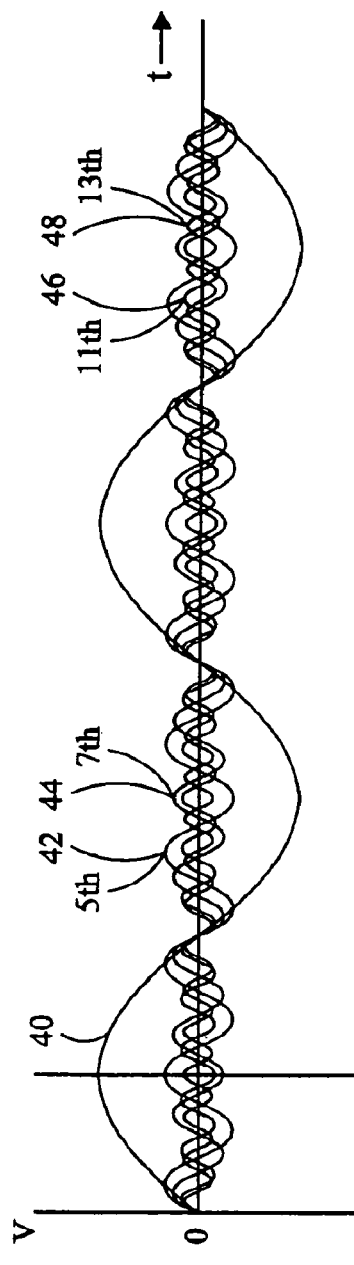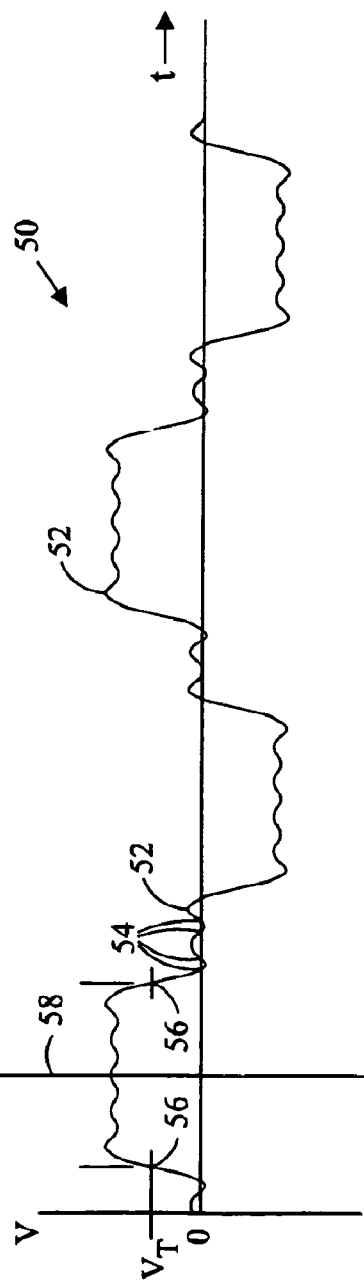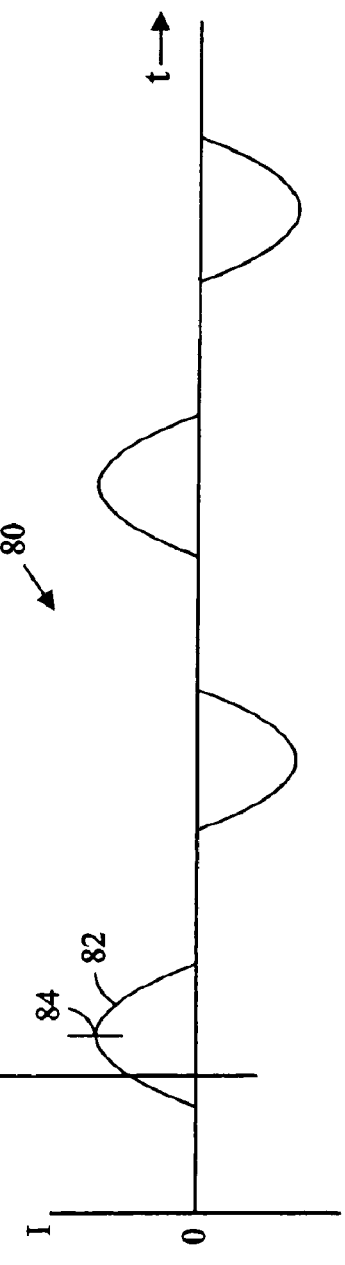

POWER METER

CROSS-REFERENCE TO RELATED APPLICATIONS

This application claims the benefit of U.S. Provisional App. No. 60/635,594, filed Dec. 13, 2004.

STATEMENT REGARDING FEDERALLY SPONSORED RESEARCH OR DEVELOPMENT

Not applicable.

BACKGROUND OF THE INVENTION

The present invention relates to electric power meters and, more particularly, to a digital power metering apparatus and method.

Electric power is typically generated at a remote, central generating facility and transported to the consumer over a distribution system. To reduce power transportation losses, a step-up, sub-transmission transformer is used to increase the voltage and reduce the current for transmission over a transmission line. The actual transmission line voltage usually depends on the distance between the sub-transmission transformers and the consumers of the electricity but is commonly in the range of 2-35 kilo-volts ("kV"). Distribution substation transformers and distribution transformers of an electric utility's secondary power distribution system reduce the voltage from the transmission line level to a distribution voltage for delivery and use by industrial, commercial, and residential consumers. In the United States, for example, electric power is typically delivered to the consumer as a 60 Hertz (Hz) alternating current voltage (AC) ranging from 120-660 volts ("V"), depending upon the use.

The consumption of power by individual consumers and the performance of the distribution system are monitored by power meters. Power meters are used to monitor a number of electrical parameters related to power distribution and use, including the active power, the time rate of transferring or transforming energy, and the apparent power, the product of the root mean square (RMS) voltage and current. In addition, the reactive power, the product of the RMS voltage and the quadrature component of the current, is commonly monitored to identify capacitive and inductive loads reducing the overall efficiency of the power distribution system. The power factor or quality factor, the ratio of active power to apparent power, is also commonly monitored. The usefulness of monitoring a variety of parameters of electric power has favored adoption of power meters that incorporate digital data processing systems. In a digital power meter, the data processing system uses appropriate mathematical formulas to calculate the various electric power parameters from digital data obtained by sampling transducer outputs that represent, respectively, the voltage and current in a transmission line supplying the load.

As generated, the fundamental AC voltage and current approximate in-phase, 60 Hertz ("Hz") sine waves over time. Referring to FIG. 1, the effective or true power of the analog sinusoidal voltage 20 and current 22 waveforms is the integral of the product of the instantaneous magnitudes of the voltage and current averaged over a time period, usually a cycle of the waveform:

$$P = \frac{1}{T}\int_0^T (v(t)i(t))\,dt \tag{1}$$

where:
P=effective or true power (watts)
v(t)=instantaneous voltage at time t
i(t)=instantaneous current at time t
T=time period, typically a waveform cycle period In a digital power meter, the sinusoidal analog voltage 20 and current 22 waveforms are digitally captured by periodically, simultaneously sampling the amplitudes of the outputs of respective voltage and current transducer outputs. The effective power is typically approximated by averaging the sum of the products of the respective instantaneous voltage and current samples for each of the plurality of sampling intervals, for example, the current-voltage product 28, making up at least one cycle of the waveform:

$$P \cong \frac{1}{T}\sum_{k=1}^{k=\frac{T}{\Delta t}} v(k)i(k)\Delta t \tag{2}$$

where:
P=effective power
v(k)=sample voltage for the k-th sample, for example voltage 24
i(k)=sample current for the k-th sample, for example current 26
Δt=sampling interval The effective or true power is the actual amount of power being dissipated in the circuit's dissipative elements, usually resistors. While the circuit's reactive elements, capacitors and inductors, do not dissipate significant power, they do produce voltage drops and current draws that reduce the overall efficiency of the power distribution system. Since the voltage drops and current draws of the reactive elements reduce the efficiency of the distribution system, the reactive power is often measured to permit isolating, reducing, and, in some cases, billing the sources producing the inefficiency.

The reactive power (Q) is equal to:

$$Q \cong \frac{\sin\theta}{T}\sum_{k=1}^{k=\frac{T}{\Delta t}} v(k)i(k)\Delta t \tag{3}$$

where:
Q=effective power (VARS)
v(k)=sample voltage for the k-th sample, for example voltage 24
i(k)=sample current for the k-th sample, for example current 26
Δt=sampling interval
θ=phase angle As generated, the sinusoidal voltage and current waveforms are in-phase, simultaneously reaching zero, maximum, and minimum amplitudes. The phase angle, expressing the temporal relationship of the voltage and current waveforms, is zero and, therefore, the reactive power is zero. If the load is purely resistive, the voltage and current will remain in phase but, if the load is capacitive or inductive, the current waveform will be temporally shifted relative to the voltage waveform so that the waveforms no longer simultaneously attain zero, maximum, and minimum voltage. In the case of a capacitive load, the current waveform is temporally shifted to precede or lead the voltage. On the other hand, if the load is inductive, the current waveform is temporally shifted to lag the voltage. Since inductive and capacitive loads produce a non-zero phase angle 30 or phase, the reactive power will have a non-zero magnitude.

Sinusoidal waveforms have definite zero crossings and amplitude peaks and, typically, either a zero crossing or an amplitude peak is selected as the distinguishing feature for temporally marking the cycles of the waveform when measuring the phase angle. Referring to FIG. 2C, on the other hand, a substantial portion of the electrical distribution system load comprises electronic loads, including variable speed drives, rectifiers, inverters, and arc furnaces, that draw current 80 in short abrupt pulses 82 rather than in a smooth sinusoidal manner. The impedances of these loads are characterized as non-linear and, when connected to a sinusoidal supply, the current flow is non-sinusoidal and not proportional to the instantaneous voltage. The non-linearity of power electronic loads produce harmonics of the fundamental voltage sine wave.

In a power distribution system, the expected frequency of the voltage or current, e.g., 50 Hz, 60 Hz, or 400 Hz, is conventionally referred to as the "fundamental" frequency, regardless of the actual spectral amplitude peak. Integer multiples of this fundamental frequency are usually referred to as harmonic frequencies or harmonics. Referring to FIGS. 2A and 2B, when a sine wave of the fundamental frequency 20 is combined with a plurality of harmonics 42, 44, 46, 48 the instantaneous amplitude of the resulting waveform 50 is a sum incorporating the instantaneous amplitude of the fundamental waveform and the temporally corresponding instantaneous amplitudes of the harmonic waveforms. Determining the phase of a waveform from an amplitude peak or a zero crossing of a harmonically distorted waveform 50 is problematic because the contributions of higher frequency harmonics commonly produces a plurality of contemporaneous amplitude peaks 52, particularly in the vicinities of the expected amplitude peaks or zero crossings of the fundamental waveform. To determine the phase angle, power meters typically include extensive computational resources for filtering harmonic frequencies or performing other forms of signal processing, such as interpolation, to enable identification of zero crossings or amplitude peaks of harmonically distorted waveforms.

Accurate measurement of electric power also requires compensation for the error introduced by the current transducer of the power meter. Typically, a resistive voltage divider is used to sense the transmission line voltage and a current transformer is used to sense the current flowing in the transmission line. A current transformer typically comprises multiple turns of wire wrapped around the cross-section of a toroidal core. A load current conductor, a transmission line conducting current to the load, is routed through the center of the toroidal current transformer core forming a transformer with single turn primary winding and a multiple turn secondary winding. When current flows in the primary winding, magnetization of the core induces a current in the secondary winding. The secondary winding is commonly connected to an instrument resistor and the flow of current in the instrument resistor produces a voltage that can be used to precisely measure the secondary current providing a basis for calculating the corresponding load current flowing in the conductor that serves as the primary winding. Ideally, the secondary current is precisely equal to the load current in the primary winding divided by the number of turns in the secondary winding:

$$I_1 = I_2(n) \tag{4}$$

where:
$I_1$=primary current
$I_2$=secondary current
n=turns ratio.

However, actual transformers are not ideal transformers and the magnetization of the core of the current transformer produces errors that affect the accuracy of the readings produced by the meter.

Current transformer error comprises a phase error and a ratio error. Part of the current in the primary winding is used to magnetize the transformer core with the result that the secondary current is less than the product of the primary current and the ratio of turns in the primary and secondary windings (turn ratio). The ratio error ($r_e$) varies with the magnitude of the primary current ($I_1$) as follows:

$$r_e(\%) = K_3 + K_4(\log I_1) \tag{5}$$

where $K_3$ and $K_4$ are constants.

The effect of the ratio error is to alter the relationship between the magnitudes of the measured secondary current ($I_2$) and the primary current ($I_1$) from the theoretical relationship to the relationship:

$$I_1 = I_2'\left(n + \frac{nr_e}{100}\right) \tag{6}$$

where $I_2'$=measured secondary current

The magnitude of the measured secondary current ($I_2'$) is related to the theoretical secondary current ($I_2$), as follows:

$$I_2 = I_2'\left(1 + \frac{r_e}{100}\right) \tag{7}$$

In addition, the magnetization of the transformer core and windings causes a phase shift between the current in the primary winding and the current in the secondary winding. The resulting phase error ($p_e$) varies with the magnitude of the primary current ($I_1$) approximately according to the relationship:

$$p_e = K_1 + K_2(I_1^{-M}) \tag{8}$$

where M, $K_1$ and $K_2$ are constants

In practice M is often approximately equal to ½ and, consequently, a square root approximation can often be conveniently employed as part of the overall correction algorithm.

The values of the constants $K_1$, $K_2$, $K_3$, and $K_4$ depend upon the configuration of the particular current transformer. Factors such as core material and turns ratio affect the values of the constants which are typically ascertained by experimentation with samples of a given core configuration. The values of $K_1$, $K_2$, $K_3$, and $K_4$ are determined for a particular transformer configuration or production batch by comparing the actual performance of a sample of the transformer configuration to the performance of a standard device when the secondary winding is connected in parallel to a particular impedance or burden.

In a typical digital power meter, an instantaneous assumed load current is obtained from the transformer turns ratio and the magnitude of the sample of the secondary current. The assumed load current is used to determine phase and ratio error correction factors that fit the characteristic curves obtained from testing the sample current transformer. The phase and ratio error correction factors are then applied to adjust the assumed load current to obtain the adjusted magnitude of the sample load current. However, a substantial quantity of data must be stored so that appropriate correction factors will be available for all assumed currents within the meter's range or additional data processing resources will be required to calculate the phase and error correction factors whenever a new current sample is processed. In any event, considerable additional data processing resources are required to adjust each sample of the secondary winding current for the phase and error ratio produced by the current transformer.

Accurate power measurement with a digital power meter also requires accurate control of the sampling interval. Sampling and digitizing the voltage and current waveforms is performed by a sampling unit that typically comprises a voltage transducer, a current transducer, and an analog-to-digital converter (ADC) that captures the amplitudes the voltage or current signals at sampling moments and coverts the discrete amplitudes to digital signals of finite precision. In addition, the sampling unit also typically includes a sampling clock to provide a precise sampling interval and one or more digital signal processors (DSP) dedicated to the tasks of initiating sampling and storing the sample values of the voltage and current output by the ADC. Typically, the dedicated DSP polls the ADCs at intervals signaled by the sampling clock to read the magnitude of the voltage or current sample. Providing a dedicated DSP to perform sampling substantially increases the data processing resources and the cost of the sampling unit.

Microprocessors are available with sufficient processing power to perform the sampling of the voltage and current waveforms as well as the other tasks related to the operation of a power meter. While microprocessors are often used to perform a plurality of tasks that may occur coincidently, interrupts are commonly used to determine the order of performance of the various tasks. When an interrupt request is received the microprocessor responds by suspending processing of a lower priority task; storing addresses for the program instructions and any intermediate results of the suspended task; and initiating processing of the interrupt service routine, the program instructions for the higher priority interrupting task. Upon completion of the interrupting task, the microprocessor returns to the interrupted task and, unless a higher priority second interrupt has been received, continues processing the interrupted task. While microprocessors are commonly used to perform multiple tasks, interrupt latency makes combining real time tasks, such as those performed by the sampling unit of a power meter, with the other data processing tasks related to meter operation problematic. Interrupt latency, the interval between the assertion of an interrupt request and the initiation of the interrupt service routine for the asserted interrupt, makes the timing of the initiation of the execution of the interrupt uncertain, making precise timing of real-time tasks, such as sampling, unreliable, and, as a result, potentially making the output of the meter inaccurate.

What is desired, therefore, is a digital data processing system and method for measuring power that combines accurate phase measurement, adjustment for current transformer induced error and reduced data processing hardware requirements.

BRIEF DESCRIPTION OF THE DRAWINGS

FIG. 2A illustrates a plot of a sine wave having a fundamental frequency and plots of the fifth, seven, eleventh and thirteenth harmonics of the fundamental sine wave.

FIG. 2B is an illustrative plot of a harmonically distorted voltage waveform comprising a combination of the fundamental frequency and the fifth, seven, eleventh, and thirteenth harmonics as illustrated in FIG. 1A.

FIG. 2C is an illustrative plot of an input current to a power electronic load.

DETAILED DESCRIPTION OF THE INVENTION

Figure 3:
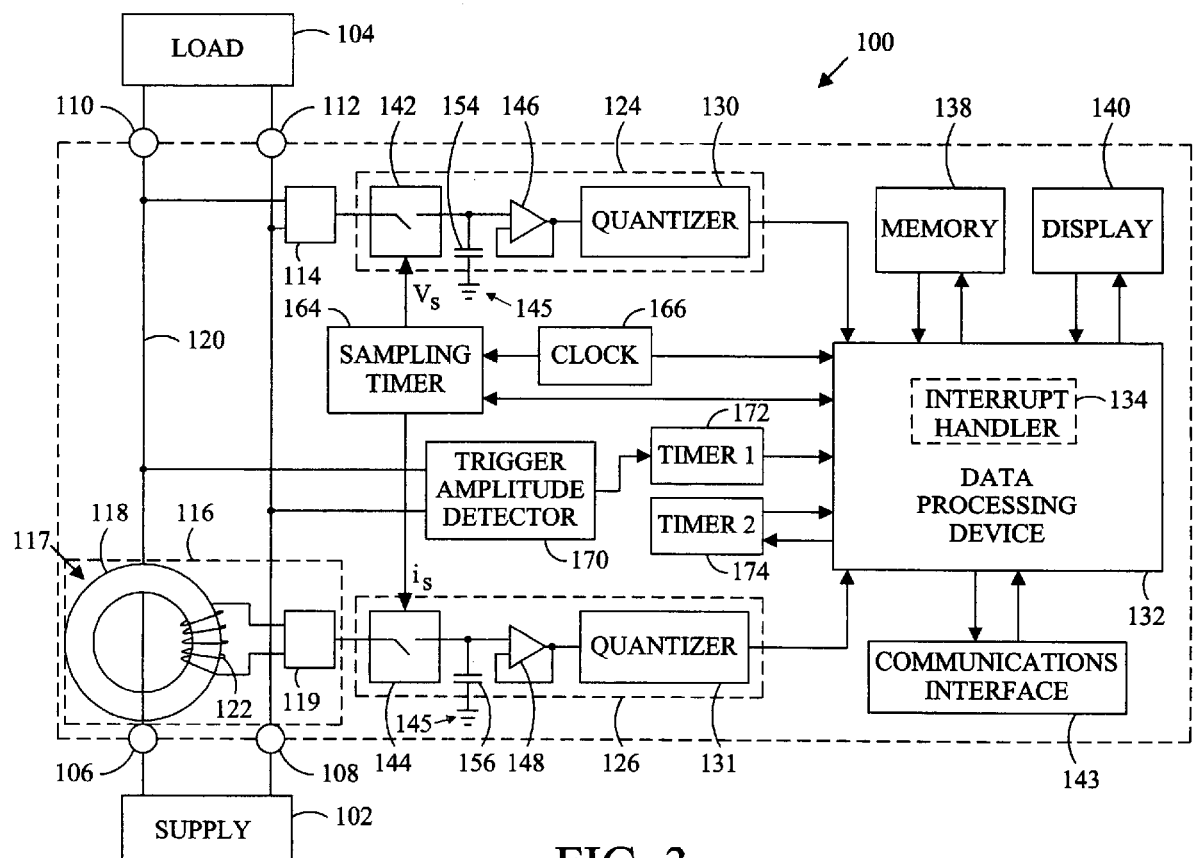
FIG. 3 is a schematic representation of an electric power meter.

Referring in detail to the drawings where similar parts of the invention are identified by like reference numerals, and, more particularly to FIG. 3, electric power consumption is monitored by a digital electrical power meter 100 adapted for connection between a supply 102 and a load (or loads) 104 of an electrical distribution system via input terminals 106, 108 and output terminals 110, 112. The supply voltage is sensed through a voltage transducer 114, typically a voltage divider resistor network, and the load current is sensed by a current transducer 116, commonly a current transformer 117 and a resistor network 119. A current transformer 117 typically comprises a secondary winding 122 comprising multiple turns of conductive wire wrapped around the cross-section of a toroidal core 118 and a primary winding comprising a conductor 120 connecting a supply terminal 116 to a load terminal 110 and passing through the aperture in the center of the toroidal core 118. The primary winding has $N_1$ turns (typically, $N_1=1$) and the secondary winding has $N_2$ turns and, thus, the current transformer 117 has a turns ratio (n) of $N_1/N_2$. Primary current passing through primary winding induces a voltage and current in the secondary winding which is connected to the resistor network 119. The amplitude of the primary current can be determined from the amplitude of the voltage at the output of the resistor network 119.

The outputs of the current transducer 116 and the voltage transducer 114 represent, respectively, the continuously varying amplitudes of the load current and voltage waveforms. An analog-to-digital converter (ADC) is used to convert a continuous variable analog signal to a plurality of discrete digital values. In the digital power meter 100, the outputs of the voltage 114 and current 116 transducers are input to respective samplers, ADCs 124, 126. The ADCs 124, 126 each comprise a sample and hold section and a quantizer section 130, 131. Although the ADCs 124, 126 are illustrated as separate devices, portions of the ADCs, for example, the quantizer sections 130, 131 may be incorporated in the data processing device 132 of the power meter. The sample and hold section keeps the voltage at the input to the quantizer section 130, 131 constant while the analog-to-digital conversion is taking place, that is, the output of the sample and hold section is allowed to change only at periodic intervals at which time the quantizer input becomes identical to the instantaneous value of the input signal from the respective voltage 114 or current 116 transducer. Changes in the signals from the voltage 114 and current 116 transducers that occur between these sampling instances are ignored.

In the digital power meter 100, the voltage and current sample and hold sections each comprise, respectively, a switch 142, 144 having a first terminal connected to a respective transducer 114, 116 and a second terminal connected to a respective amplifier 146, 148 and a capacitor 154, 156 connecting the second terminal of the switch to ground 145. A sampling timer 164 outputs a voltage sampling signal 160 causing actuation of the voltage switch 142 and a current sampling signal 162 to actuate the current switch 144. When the switches 142, 144 are closed, the output of the respective voltage 114 and current 116 transducer is connected to the second terminal of the corresponding switch charging the respective capacitor 154, 156 to a voltage equal to the magnitude of the signal at the output of the voltage or current transducer. When a switch 142, 146 is opened, in response to the respective sampling signal 160, 162, the capacitor 154, 152 maintains the voltage at the input to the respective amplifier 146, 148 at the voltage of the transducer output at the time of switch opening. In the voltage quantizer 130 and the current quantizer 131, the respective sample of voltage or current signal is converted to a discrete, binary value of finite precision. Sampling converts time, the independent variable of the sinusoidal waveform equation, from a continuum to a plurality of discrete moments and the value of the dependent variable, the transducer voltage or current signal, respectively, to a discrete binary number.

The outputs of the ADCs 124, 126 are read by a data processing system. In a typical digital power meter, the data processing system comprises a sampling unit data processor, typically a microprocessor or digital signal processor (DSP), that is dedicated to the task of reading and storing the digital number quantifying each of the current and voltage sample values and a second data processor, including program instructions, data storage and peripheral devices, that is adapted to read the stored digital sample values and calculate the current, voltage, power, and other electrical parameters that are output by the power meter. A 3-phase power meter commonly includes a sampling unit for each of the three phases and each sampling unit typically comprises a voltage transducer, a current transducer, ADCs, and a sampling unit data processor. However, providing a data processor dedicated to the tasks of sampling the voltage and current adds data processing capabilities and costs to the power meter that would be unnecessary if the sampling could be controlled and performed by the data processor that performs other functions of the power meter, such as calculating the electrical parameters to be output by the meter.

Figure 4:
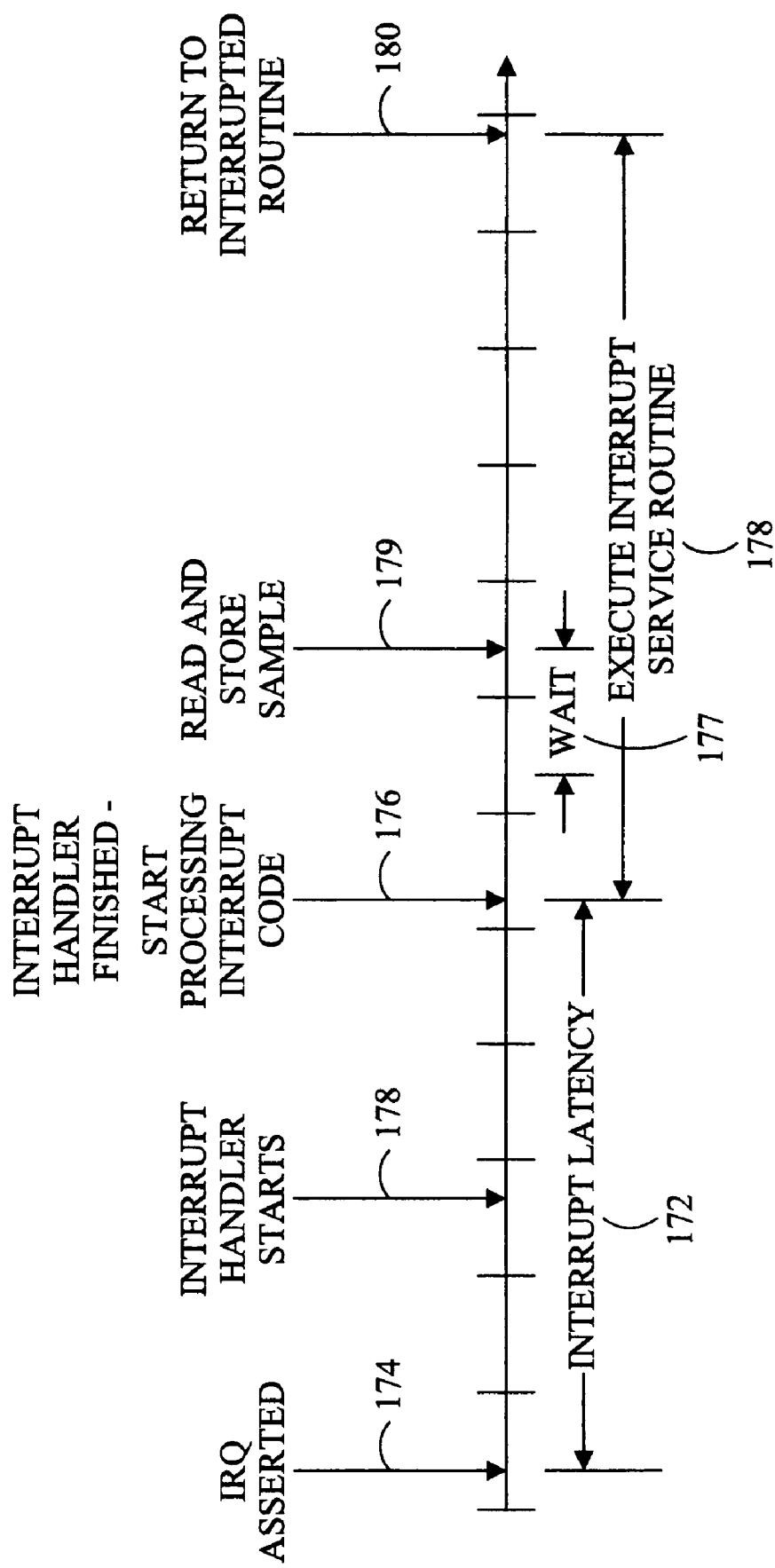
FIG. 4 is pictorial representation of an exemplary interrupt process.

While the processing power of microprocessors has increased substantially and microprocessors are commonly used to perform multiple tasks, interrupts are commonly utilized to switch between tasks that may occur coincidently and interrupt latency is problematic when performing real-time tasks. A microprocessor responds to an interrupt request signal, usually from external hardware, by suspending processing of a lower priority task, storing pointers to the interrupted program instructions and any intermediate results of the suspended task, and initiating processing of the program instructions of the interrupt service routine, the program instructions for the higher priority interrupting task. Upon completion of the interrupting task, the microprocessor returns to the interrupted task and, unless a higher priority second interrupt has been received, continues processing the interrupted task. Referring to FIG. 4, interrupt latency refers to the time interval 172 between the assertion of an interrupt request 174 and the initiation of the program instructions of the interrupt service routine for the asserted interrupt 176. Interrupt latency varies with the architecture of the data processing device and the operation being performed when an interrupt request is asserted. As result, timing of the initiation of the interrupt service routine is uncertain and timely performance of real-time tasks, such as sampling, is unreliable. However, the applicant concluded that a microprocessor could be used to perform real-time tasks, such as sampling, as well as other tasks required for a power meter, if a signal to initiate a high priority interrupt was issued in anticipation of the latency of the interrupt so that the data processing device was prepared to execute a program instruction and perform a task, such as reading a sample value from the ADC, at the appropriate execution time for the instruction.

In the power meter 100, the digital outputs of the ADCs 124, 126 that sample the outputs of the voltage 114 and current 116 transducers are read by a data processing device 132, typically, a microprocessor, programmable logic device (PLC), or digital signal processor. The device is part of a data processing system comprising the data processing device 132, program instructions, and related data storage and peripheral devices. The data processing system includes a memory 138 that is adapted to store instructions and data (e.g., number of turns in the secondary winding, voltage sample values, current sample values, etc.) used by the data processing device in calculating the current, voltage, power, and other related electrical parameters. The data processing device 132 is also connected to a display system 140 permitting display of the metered quantities. A user interface may be incorporated in the display section permitting manual selection of different metered quantities for display and entry of data related to meter operation. Other peripheral devices, components, and features may be provided including, for example, a communications interface 143 that enables remote reporting of the meter results or transmission of instrument data to a remote data processing system.

The data processing device 132 includes an interrupt handler 134 providing an interface for assertion of an interrupt request (IRQ) signal by a device such as a sampling timer 164. While interrupts commonly originate with devices external to the associated data processing device, the sampling timer 164 may be an external device or may be created internally in the data processing device 132 and its memory 138. When an IRQ is asserted 174, operation of the interrupt handler 134 is initiated 178. The interrupt handler 134 determines the priority of the interrupt and whether the asserted interrupt can be masked, that is, delayed until completion of some current task. Since sampling is performed in real time, the sampling interrupt is typically designated as a non-maskable, high priority interrupt. The interrupt handier 134 routes the interrupt signal to the core of the data processing device 132 which typically saves the addresses of the next instruction and any intermediate results for the interrupted program, disables lower priority interrupts, and jumps to the starting address or interrupt vector of the interrupt service routine, the program instructions for the interrupting task. When the interrupt handler has finished 176, the data processing device is ready to perform the first instruction of an interrupt service routine containing an instruction for reading and storing the output of at least one of the ADCs 124, 126. When the data processing device 112 has completed the program instructions of the interrupt service routine, it recovers the addresses related to the instructions and data for the interrupted task and begins executing the interrupted task 180.

Figure 5:
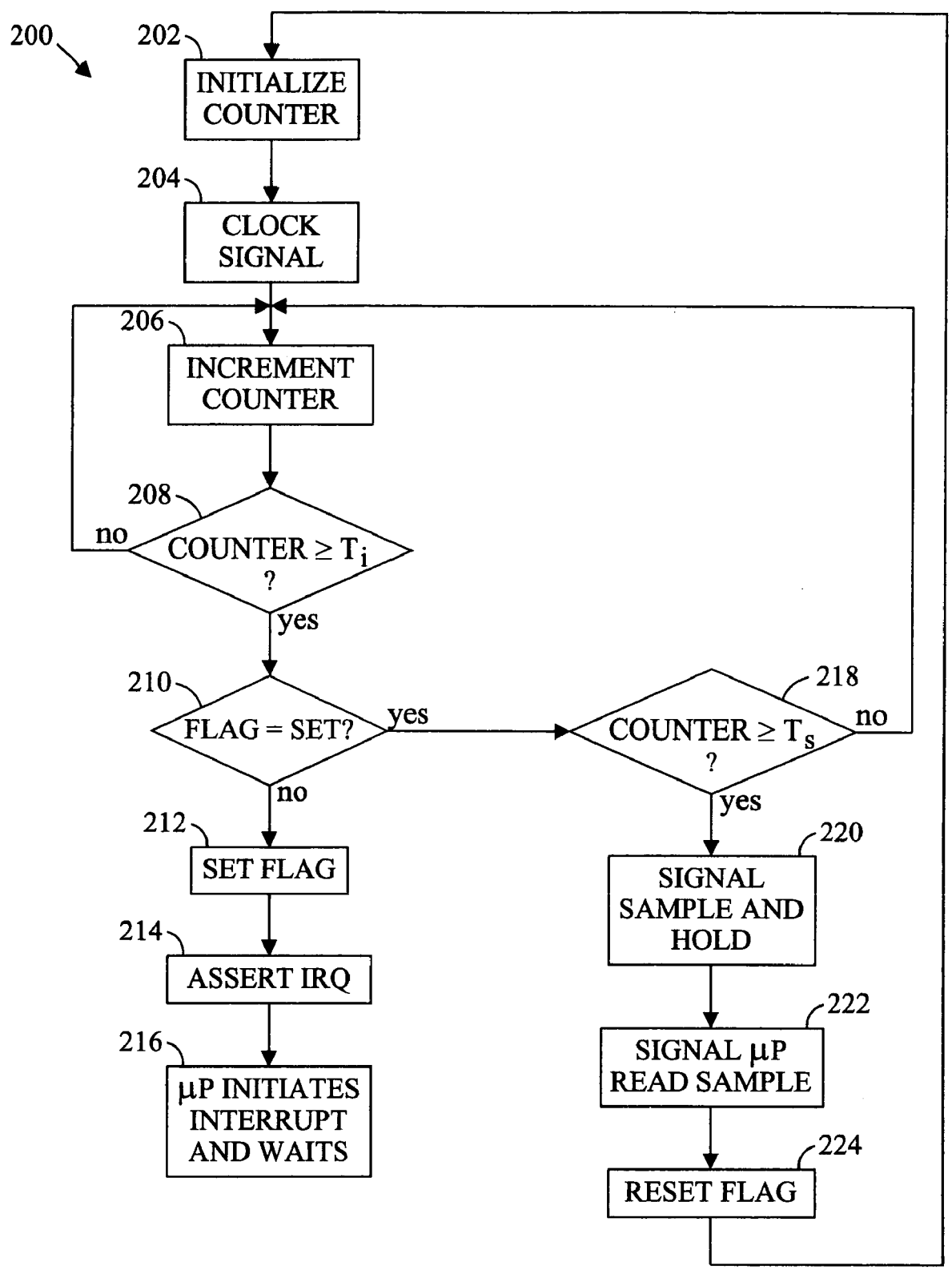
FIG. 5 is a block diagram of a method of waveform sampling utilizing an interrupt.

Referring to FIG. 5, in the power meter 100, the interrupt request signal to initiate the sampling interrupt is provided by the sampling timer 164. The sampling interrupt process 200 begins with initialization of a counter 202 of the sampling timer 164 by the data processing device 132. A clock 166, which may be an external clock or the internal clock providing timing signals to the data processing device, provides timing signals to the sampling timer 164. When a clock signal is received 204 from the clock 166 the counter is incremented 206. The accumulated count of the counter is compared to a first set time ($t_i$) for asserting the sampling interrupt request with the data processing device 208. The time for asserting the interrupt request for the sampling interrupt 154 is at least equal to the difference between the sampling interval and the sum of the interrupt latency 172 and any time required to execute program instructions of the sampling interrupt service routine that are to be executed before the data processing device 132 is ready to read and store the output of the ADCs.

If the time corresponding to the clock signal count accumulated on the counter has not reached the interrupt request initiation time 208, the counter continues to increment in response to clock signals. However, if the time has reached the interrupt request initiation time 208 and a flag has not been set indicating that the interrupt request has been asserted 210, the interrupt request flag is set 212, and the interrupt request is asserted 214 at the data processing device 132. The interrupt handler 134 is started 178 initiating the interrupt 216 by storing addresses for instructions and data for the interrupted task and obtaining the interrupt vector for the interrupt service routine for the sampling interrupt. The interrupt handler 134 finishes and the data processing device may begin processing the sampling interrupt service routine if additional action is necessary to prepare the data processing device to read sample values 216. In response to a program instruction in the sampling interrupt service routine, the data processing device 132 pauses 177 in anticipation of a second signal from the sampling timer 216.

The counter continues to increment 206 in response to signals from the clock 204 and, since the interrupt request flag is set 210, the time corresponding to the accumulated clock signal count is compared to the sampling interval 218. When the time corresponding to the accumulated clock signal count on the counter equals a second set value, the sampling interval 218, at least one of the voltage 150 and current 152 sampling signals is sent to the corresponding switch 142, 144 of at least one of the ADCs 124, 126 to hold the input to the respective quantizer 130, 131 at the current value of the output of the respective voltage 114 or current 116 transducer 220. The signal also causes the data processing device 132 to execute the program instructions of the sampling interrupt service routine causing the data processing device to read and store the digital output of at least one of the ADCs 222. The data processing device reads and stores the ADC outputs for the sample 179 and completes the sampling interrupt service routine before returning to the interrupted task 180. The sampling signal from the counter also resets the interrupt request flag 224 and initializes the counter 202 to begin timing the next sampling interval. By asserting an interrupt request in anticipation of a period of latency preceding readiness of the data processing device to execute an instruction included in an interrupt service routine, the data processing system of the power meter 100 can reliably execute the program instruction at the appropriate execution time for performing a real time task, such as sampling the voltage and current, as well as performing other tasks related to the power meter's operation.

Figure 1:
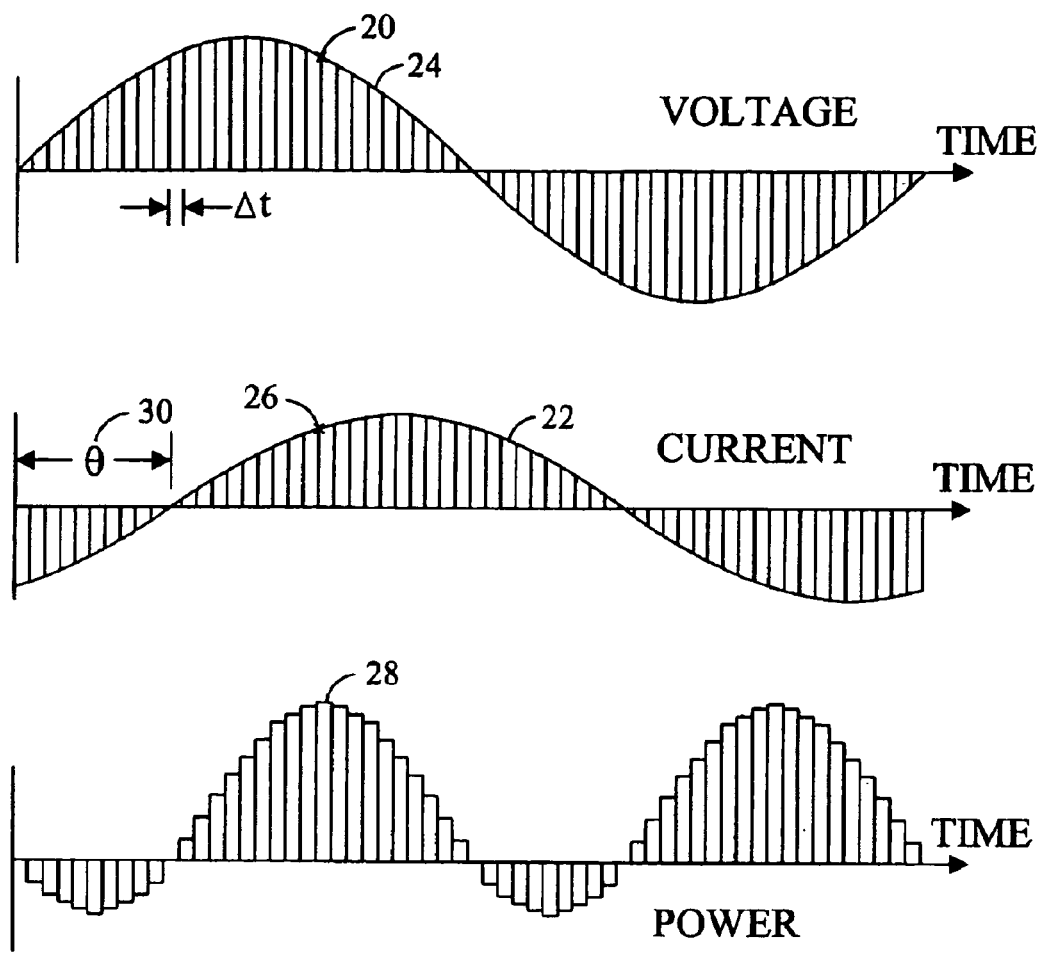
FIG. 1 is a pictorial representation of a calculation of electric power from the results of periodic sampling of voltage and current sine waves.

Referring to FIG. 1, in the typical digital power meter, the effective power is approximated by averaging the sum of the products of the respective instantaneous load voltage and current samples for each of the plurality of sampling intervals making up at least one cycle of the waveform:

$$P \cong \frac{1}{T} \sum_{k=1}^{k=\frac{T}{\Delta t}} v(k)i(k)\Delta t \quad (2)$$

where:
P=effective power
v(k)=sample voltage for the k-th sample, for example voltage 24
i(k)=sample current for the k-th sample, for example current 26
Δt=sampling interval The instantaneous values of the sinusoidal analog voltage and current waveforms are digitally captured by periodically, simultaneously sampling the amplitudes of the outputs of respective voltage and current transducers.

Before calculating electrical parameters based on the current, such as real power, total power, reactive power etc., the data processing system typically adjusts the value of the instantaneous load current to compensate for the effects of phase error and ratio error introduced by the current transformer. Typically, an initial or assumed value of the primary or load current is determined from the measured secondary current using the theoretical relationship of the primary current and the secondary current for an ideal transformer:

$$I_1 = I_2(n) \quad (4)$$

where:
$I_1$=the primary current
$I_2$=the secondary current
n=turns ratio

The data processing system then uses the assumed load current to access one or more ratio and phase error correction factors that are typically stored in a memory and, using a correction algorithm, applies the correction factors to the assumed load current to calculate the adjusted or actual load current.

Figure 6:
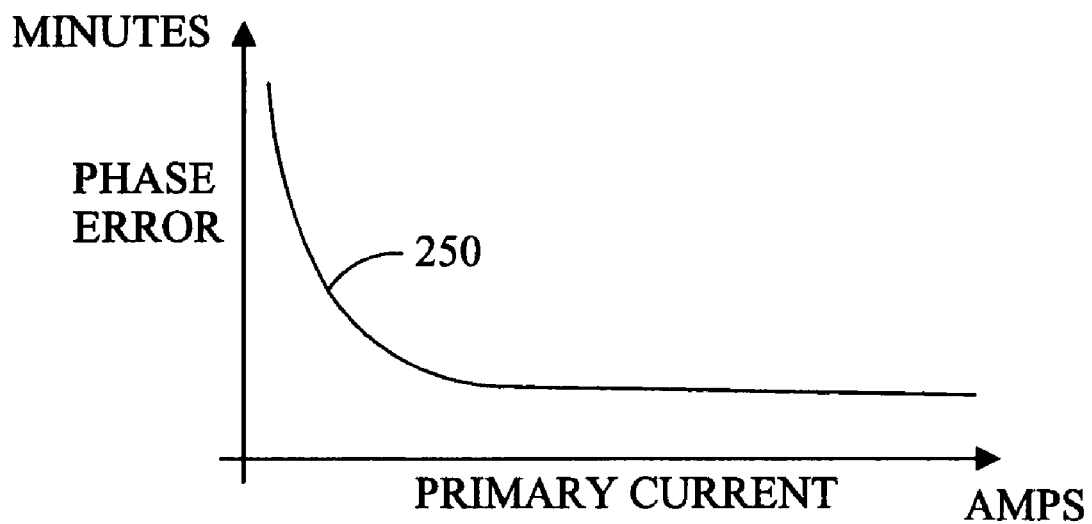
FIG. 6 is a graph of phase error versus primary current for an exemplary current transformer.
Figure 7:
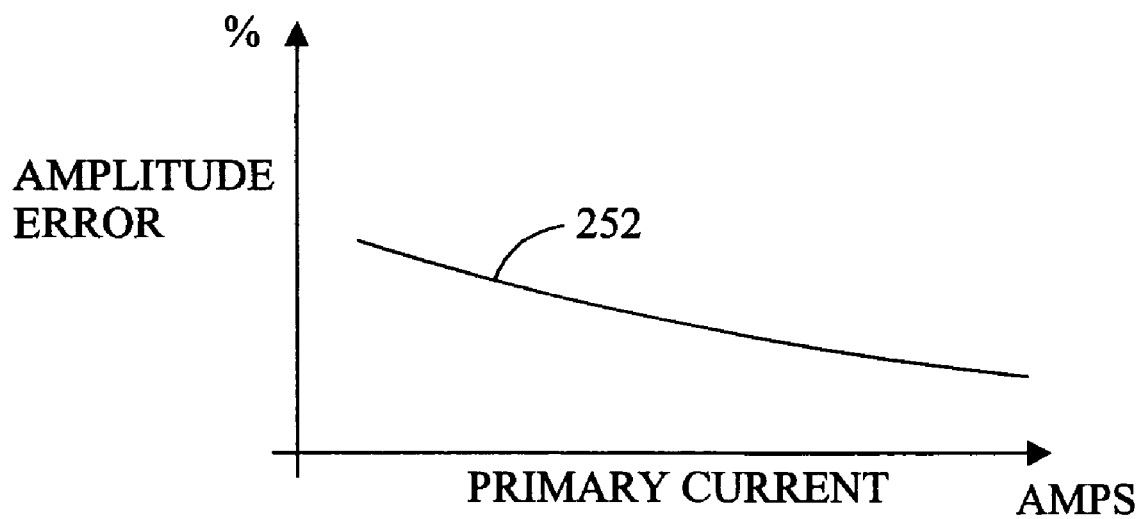
FIG. 7 is a graph of ratio error versus primary current for an exemplary current transformer.

The ratio and phase errors are obtained by testing a sample transformer having a core configuration that matches the core configuration of the current transformer used in the power meter. Referring to FIGS. 6 and 7, characteristic curves, for example curves 250, 252, relating the phase error and ratio error to the primary current are obtained by operating a sample transformer over the expected operating range of primary currents with a known impedance or test burden connected to the secondary winding. Phase and ratio correction factors, fitting the characteristic curves obtained by testing, are typically stored as a table or an equation that is accessible to the meter's data processing system. From the assumed load current, the data processing system selects or calculates the appropriate ratio and phase error correction factors to be applied when adjusting an assumed load current in a manner defined by the meter's current adjustment algorithm.

Accurate metering requires a correction factor or factors appropriate for each instantaneous primary current value within the range of the meter's current rating when the meter is operated with an actual burden that matches the impedance of the test burden. A substantial quantity of data must be the stored and accessed so that appropriate correction factors will be available for all assumed load currents within the meter's range or additional computing resources must be provided to calculate the correction factors from an equation whenever a new assumed load current is calculated. In either event, considerable calculating resources are required to calculate an adjusted load current for each assumed load current calculated from a secondary current sample. In addition, the correction factors are obtained by testing samples of similarly configured transformers and are not necessarily accurate for the specific transformer used in a particular meter. The present inventor realized that the root mean square (rms) of the load current changes more slowly and over a narrower range than the instantaneous load current and that the computational and data storage requirements of a power meter could be reduced if a current transformer phase error correction value was determined from the rms value of the assumed load current. The inventor further concluded that the computational requirements could be further reduced by dynamically adjusting the temporal relationship of the voltage and current samples to account for the phase error produced by the current transformer.

Figure 8:
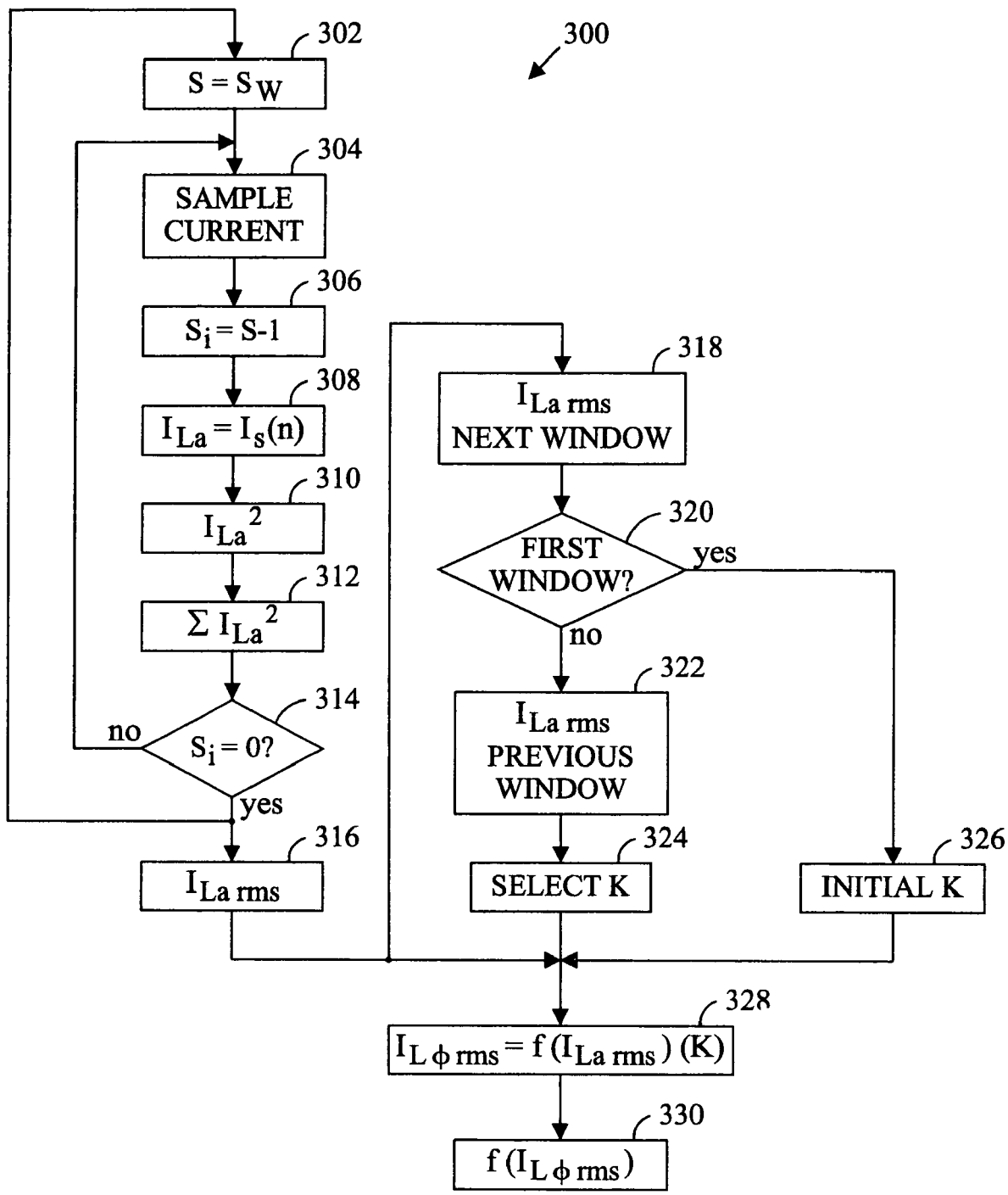
FIG. 8 is a flow diagram of a method of determining load current in an electric power meter incorporating a current transformer.

In the power meter 100, the instantaneous load current is determined from periodic samples of the current induced in the secondary winding 122 of the current transformer 117 by the load current flowing in primary winding, the conductor 120. Referring to FIG. 8, when the data processing device 132 initializes a sample counter to a predetermined number of samples to be included in a sampling window 302, the method of determining the load current 300 is initiated. The secondary current is sampled 304 and the sample counter is decremented 306. The instantaneous assumed load current ($I_{La}$) for an ideal transformer is calculated by multiplying the sample secondary current ($I_s$) by the turns ratio (n) of the current transformer 308. The assumed load current is squared 310 and the result is added to the sum of the squared assumed load currents 314 accumulated for preceding samples in the sampling window 312. If the accumulated number of samples is less than the number of samples specified for the sampling window 304, the data processing system samples the secondary current again at the appropriate time 304, decrements the sample counter 306, and repeats the calculations in steps 308, 310, 312.

When the number of samples equals the number of samples specified for the sampling window 314, the sample counter is reset 302 and the root mean square (rms) of the assumed load currents accumulated for the sampling window is calculated 316. The rms assumed load current is equals:

$$I_{La\,rms} = \sqrt{\frac{\sum I_{La}^2}{S_w}} \quad (8)$$

where:
$I_{La\,rms}$=the root means square of the assumed load current
$I_{La}^2$=the square of the assumed load current
$S_w$=the number of samples in the sampling window The calculated assumed rms load current 316 is stored as the anticipated assumed rms load current for the next sampling window 318. If the present sampling window is the initial sampling window 320, one or more predetermined phase correction factors (K) 326 are selected by the data processing system. If the present sampling window is not the initial sampling window 320, the assumed rms load current from the previous sampling window is retrieved from memory 322 and used to select or calculate one or more corresponding phase correction factors for the current sampling window 324. The initial or selected phase correction factor(s) is input to a phase correction algorithm to determine the phase corrected rms load current ($I_{L\,\varnothing\,rms}$) 328 which is used by the data processing device 132 to calculate other functions of the rms load current 330 such as the power.

Figure 9:
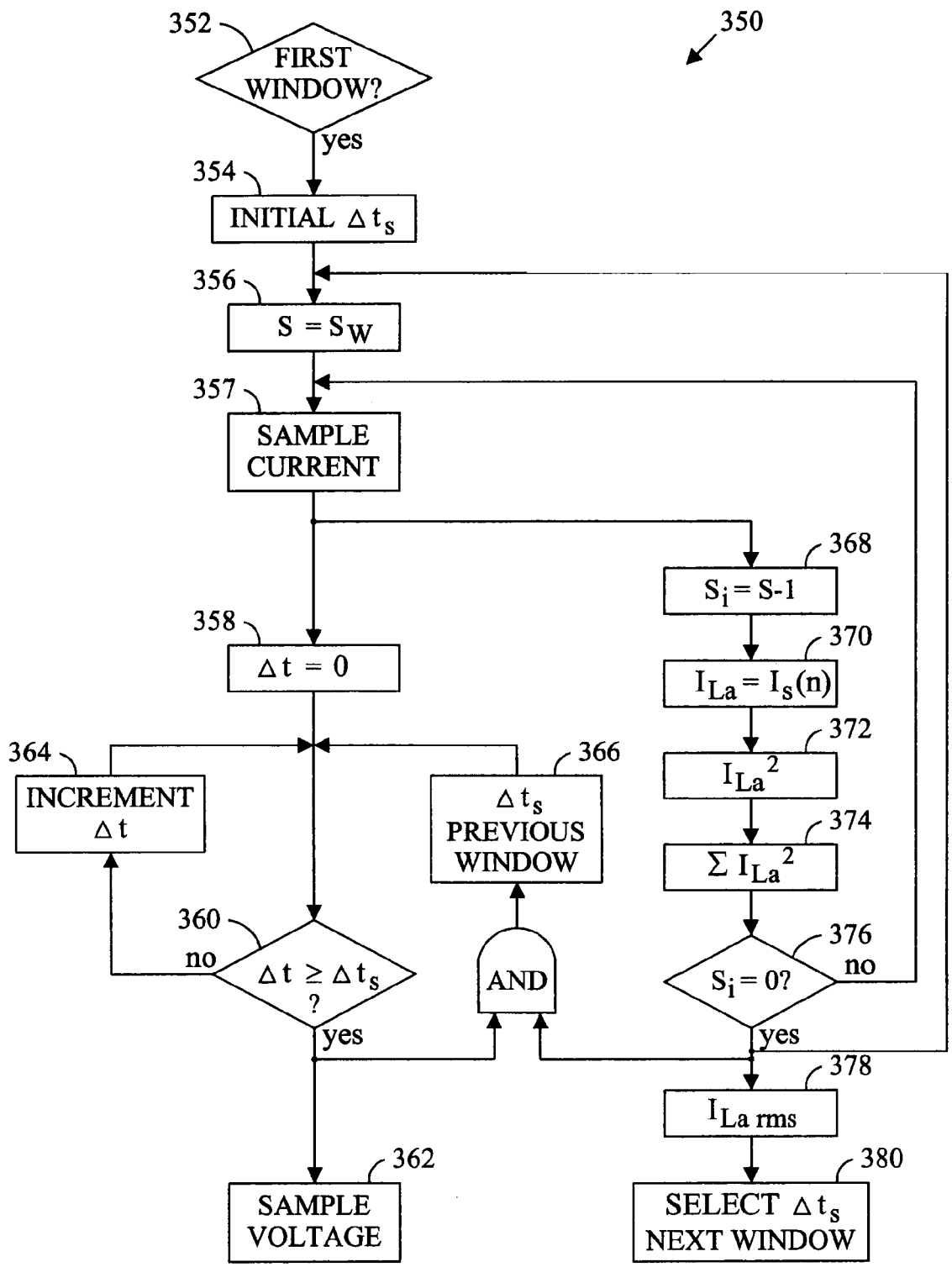
FIG. 9 is a flow diagram of a second method of determining load current in an electric power meter incorporating a current transformer.

Referring to FIG. 9, another embodiment of the current transformer phase adjustment method 350 is illustrated. In the power meter 100, voltage and the current sampling are initiated by independent voltage 160 and current 162 sampling signals from the sampling timer 164. Initially the current switch 144 and the voltage switch 146 are both closed connecting, respectively, the current transducer 116 and the voltage transducer 114 to the corresponding current capacitor 156 and voltage capacitor 154 and imposing charges on the voltage and current capacitors reflecting the outputs of the respective voltage and current transducers. The assumed rms load current for a previous sampling window is used to select a phase error correction interval corresponding to a temporal shift of the current transformer output relative to the load current produced by the phase error of the current transformer.

The data processing device 132 initializes a sample counter to a predetermined number of samples to be included in a sampling window 356. The current switch 144 is opened in response to the current sampling signal 152 from the sampling timer 164 while the voltage switch 142 remains closed. The voltage level at the second terminal of the current switch 144 is maintained at the input to the amplifier 148 by the current capacitor 156 while the voltage at the second terminal of the voltage switch 142 continues to follow the voltage at the output of the voltage transducer 114. The data processing device 132 samples the current 357 by reading the binary output of the current quantizer 131 representing the output of the current amplifier 148. When the current sampling signal 152 is output by the sampling timer 164, a timer is initiated to time a sampling differential interval ($\Delta t$) 358. The sampling differential interval is compared to the phase correction interval ($\Delta t_s$) 360. If the current sampling window is the initial sampling window 352, an initial phase correction interval is selected 354. However, the phase correction interval corresponding to an assumed rms current for a previous sampling window is typically determined from a table equating a plurality phase correction intervals to rms currents 366.

When the current is sampled 357 and the sample counter is decremented 368. The assumed or instantaneous load current ($I_{La}$) for an ideal transformer is calculated by multiplying the sample secondary current ($I_s$) by the turns ratio (n) of the current transformer 370. The assumed load current is squared 372 and the result is added to the sum of the squared assumed load currents accumulated for preceding samples in the sampling window 374. If the accumulated number of samples is less than the number of samples specified for the sampling window 376, the data processing system samples the secondary current again at the appropriate time 357, decrements the sample counter 368, and repeats the calculations in steps 370, 372, and 374. When the number of samples equals the number of samples specified for a sampling window 376, the sample counter is reset 356 and the root mean square (rms) of the assumed load currents accumulated for the sampling window is calculated 378. The calculated rms load current is used to select the phase correction interval for the next sampling window 380.

The sampling differential interval timer continues to decrement 364 until the phase correction interval has lapsed 360. Then the voltage switch 142 opens in response to the voltage sampling signal 150 from the sampling timer 164. The voltage capacitor 154 maintains the voltage at input of the voltage amplifier 146 at the level of the output of the voltage transducer when the voltage switch was opened while the voltage quantizer 130 converts the amplitude of the output of the voltage amplifier 146 to a binary value which is read by the data processing device 132. Thereafter, the switches 142 and 144 are preferably closed for the next sampling interval.

Temporally offsetting the sampling of the current relative to the sampling of the voltage adjusts for the phase shift of the current produced by the current transformer. The phase shift of the current as a result of the current transformer may be determined on the basis of the rms current ($I_{RMS}$) but, other measures may also be used to determine the appropriate temporal delay in the sampling, as desired. The sensed current level from the current capacitor 156 and the sensed voltage level from the voltage capacitor 154 may be used to determine the power. A data set collected from sampling the current levels may be used to determine $I_{RMS}$, which may be used to calculate the temporal offset in the sampling of the voltage and current levels. Other switching configurations may likewise be used, as desired. Current transformer induced phase error is load current dependent but the data storage and processing resources of an electric meter can be reduced if the rms load current is used in selecting and applying of phase error correction.

Referring to FIG. 2A, electric power is commonly generated and delivered to a consumer as an alternating current (AC) voltage. An AC waveform is a periodic waveform comprising a plurality of substantially similar cycles approximating a sine wave with time. As generated and delivered to the electrical distribution system, the AC voltage and current sine waves are expected to have a particular frequency known as the fundamental frequency. In the United States, the fundamental frequency is typically 60 Hz.

The sinusoidal AC voltage and current waveforms are defined, respectively, by the equations:

$$v = V_m \cos(\omega t + \theta_v) \quad (9)$$

$$i = I_m \cos(\omega t + \theta_i) \quad (10)$$

where:
v=instantaneous voltage
$V_m$=maximum voltage of the fundamental waveform
i=instantaneous current
$I_m$=maximum current of the fundamental waveform
ω=angular frequency of the sinusoidal function
$\theta_v$=phase angle of the sinusoidal voltage
$\theta_i$=phase angle of the sinusoidal current The voltage and current phase angles ($\theta_v$, $\theta_i$) express the amplitude of the respective waveform at the time that a measurement is initiated (t=0). Since the position of the time axis is arbitrary, either the voltage phase angle ($\theta_v$) or the current phase angle ($\theta_i$) is commonly assumed to be zero and the phase angle or phase (θ) expresses the relative angular displacement relationship, and, therefore, the relative temporal relationship of a distinguishing feature of two periodic waveforms, as indicated by the following:

$$v = V_m \cos(\omega t) \quad (11)$$

$$i = I_m \cos(\omega t + \theta) \quad (12)$$

The relative phase or phase angle 30 of a pair of periodic waves is determined by resolving the temporal difference in the occurrence of corresponding cyclic distinguishing features of the cycles of the two waveforms. As generated, the AC voltage and current waveforms are "in phase," sine waves that simultaneously attain zero, maximum, and minimum amplitudes. If the load is purely resistive, the voltage and current remain in phase (θ=0). However, inductance or capacitance causes temporal shifting of the sinusoidal current and voltage waveforms so that the peak and zero amplitudes of the waveforms no longer occur simultaneously (θ≠0). While inductance and capacitance cause a phase shift, a change in the phase angle, the impedance of resistive, capacitive, and inductive loads is linear and the sinusoidal current and voltage waveforms are not distorted by the load. Since a sine wave exhibits discrete zero crossings and amplitude peaks, a zero crossing or amplitude peak of one of the waveforms, a reference waveform, is commonly used to temporally distinguish the cycles of the reference waveform so that the interval and, consequently, the phase angle to a corresponding zero crossing or amplitude peak of the other waveform can be measured.

Increasingly, however, the loads imposed on electrical distribution systems comprise power electronic loads, including AC and DC variable speed drives, power rectifiers and inverters, arc furnaces, and discharge lighting, such as fluorescent lighting. Typically, power electronic loads include a front end section comprising a rectification bridge and a parallel input filter capacitor. The front end section acts as a peak detector because current flows to charge the capacitor only during a portion of each half cycle of the sine wave when the instantaneous AC voltage exceeds the voltage on the capacitor. Between these current peaks, the load draws energy stored in the capacitor.

Referring to FIG. 2C, power electronic loads draw current 80 in short abrupt pulses 82 rather than in a smooth sinusoidal manner and are characterized as non-linear. The current flow to a non-linear load is not proportional to the instantaneous voltage and is not sinusoidal. Referring to FIG. 2A, when connected to a sinusoidal voltage, non-linear power electronic loads produce harmonics of the fundamental voltage sine wave. The expected frequency of the voltage or current is conventionally referred to as the "fundamental" frequency, regardless of the actual spectral peak and integer multiples of this fundamental frequency are usually referred to as harmonic frequencies or harmonics.

The specific harmonics produced by a power electronic load are determined by the number of rectifiers (pulse number) used in the rectification circuit and can determined by the equation:

$$h = (n \times p) \pm 1 \quad (13)$$

where:
n=an integer (1, 2, 3 . . . )
p=number of pulses or rectifiers

For example, a typical six-pulse rectifier commonly used in a 3-phase, 60 Hz circuit produces odd harmonics, including fifth and seventh harmonics (h=(1×6)±1) (300 Hz and 420 Hz); eleventh and thirteenth harmonics (660 Hz and 780 Hz); seventeenth and nineteenth harmonics (1020 Hz and 1140 Hz), and twenty-third and twenty-fifth harmonics (1380 Hz and 1500 Hz). When a fundamental waveform is combined with its harmonics, the instantaneous amplitude of the resulting waveform comprises a sum incorporating the instantaneous amplitudes of the fundamental wave and each of the harmonic waves. As illustrated in FIG. 2B, a significantly distorted waveform 50 is the result of combing a sine wave 40 of the fundamental frequency with its fifth 42, seventh 44, eleventh 46, and thirteenth 48 harmonics. In addition, the harmonic distortion produces a succession of localized amplitude peaks 52, particularly in the vicinities of the expected zero crossings and amplitude peaks of the fundamental waveform and, as a result, the harmonically distorted waveform 50 typically includes a plurality contemporaneous zero crossings 54 and amplitude peaks 52. If a zero crossing or peak amplitude is used to temporally distinguish the cycles of a harmonically distorted waveform, such as, the distorted voltage waveform 50, either filtering to remove the harmonic components or computationally intensive interpolation is required to consistently determine the amplitude that distinguishes the cycles of the waveform. The present inventor concluded that extensive filtering would not be required and the data processing resources of a power meter could be substantially reduced if, for phase measurement, the cycles of a waveform were temporally distinguished at a trigger amplitude that is greater than zero but less than a peak amplitude of the waveform.

The amplitudes of the harmonics 42, 44, 46, 48 are substantially less than the amplitude of the fundamental waveform and are not arithmetically summed but combined by root mean square (RMS) summation, as follows:

$$V_{rms} = (V_1^2 + V_2^2 + V_3^2 + \ldots + V_n^2)^{1/2} \tag{14}$$

where:
$V_{rms}$=the rms voltage
$V_n$=the rms voltage of the nth harmonic

The present inventor realized that the local amplitude peaks 52 are typically less than ten percent of the peak amplitude of the fundamental waveform and a trigger amplitude greater than 10% of the peak amplitude of the fundamental waveform and less than 90% of the peak amplitude of the fundamental waveform substantially avoids the amplitude dithering that occurs in the vicinities of the expected zero crossings and amplitude peaks of the fundamental waveform. In addition, a trigger amplitude substantially intermediate to zero amplitude and the peak amplitude, for example, 50 V for a 120 V system, provides the greatest resistance to false triggering from harmonic distortion and is the least affected, temporally, by the harmonic distortion. Further, the inventor realized that, as result of rms summation, the maximum amplitude of a harmonically distorted waveform is approximately equal to the maximum amplitude of the fundamental frequency component of the distorted waveform and a trigger amplitude based on the maximum amplitude of the fundamental frequency component has substantially the same immunity to false triggering as a trigger amplitude based on the maximum amplitude of the distorted waveform.

Figure 10:
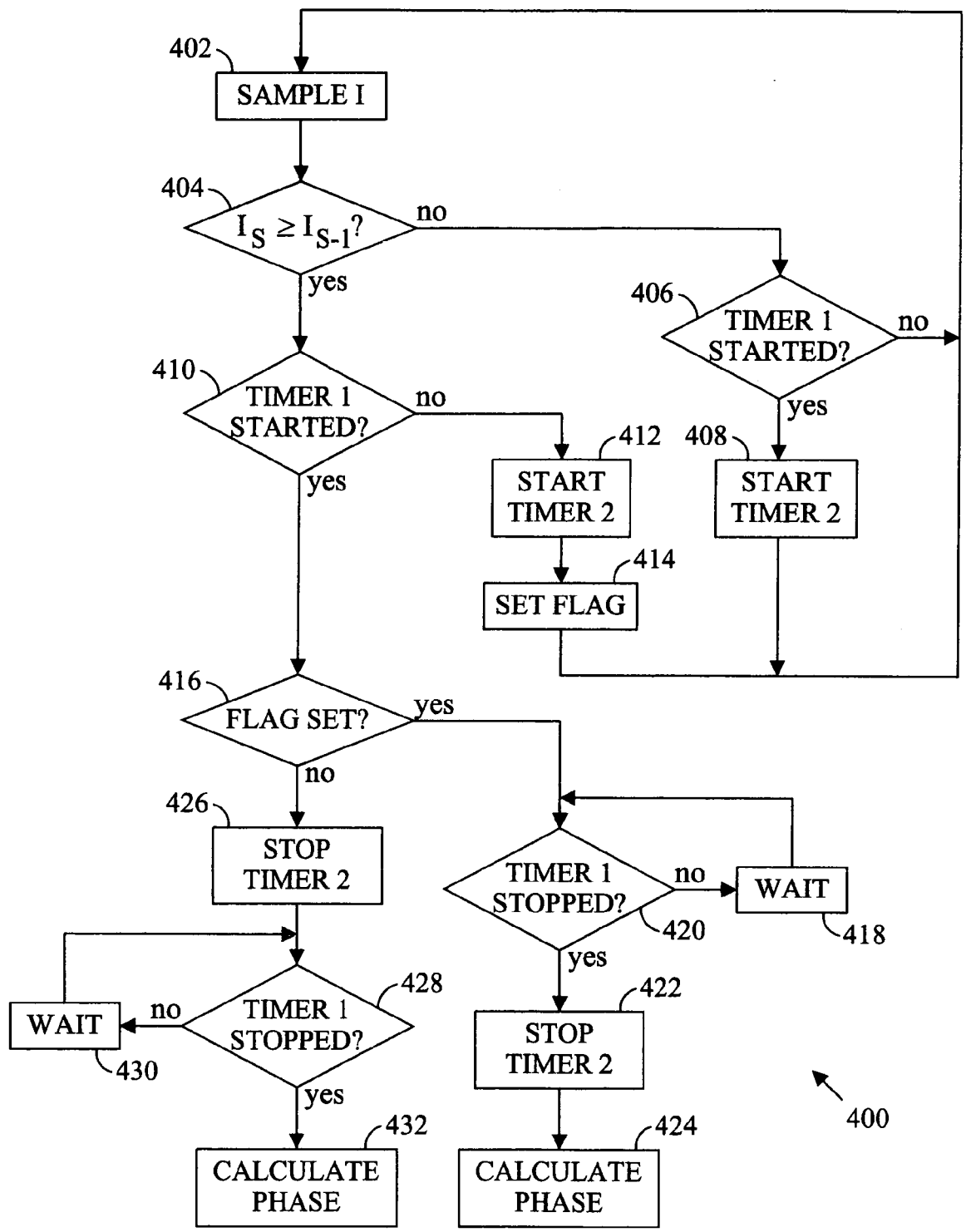
FIG. 10 is a flow diagram of a method of determining the phase angle of two periodic waveforms.

The relative phase or phase angle of two periodic waveforms of known frequency is proportional to the time interval elapsing between the occurrences of amplitudes that distinguish the repetition of cycles of the waveforms. Referring to FIG. 10, in the phase angle measurement method 400 used in the power meter 100, the phase angle between a first waveform, for example, the input current 80 to a power electronic load, and a harmonically distorted reference waveform, for example, the harmonically distorted voltage 50 is determined by timing an interval between occurrences of temporally distinguishing amplitudes of the two waveforms. The cyclic pulses of the first waveform, the current, are conveniently temporally marked at the peak 84 of the amplitude pulse by testing whether the amplitude of present sample exceeds the amplitude of the previous sample. However, other features might be used to distinguish cycles of the current waveform.

On the other hand, occurrences of an amplitude equaling a trigger amplitude are used to distinguish cycles of the harmonically distorted reference waveform, the voltage 50. Even though the waveform is harmonically distorted, the cycles of the periodic wave are substantially symmetrical about the expected maximum amplitude of the fundamental frequency 58 which occurs at substantially one-half of the interval between the occurrences of the trigger amplitudes 56 on the increasing and decreasing slopes of the cycle. In addition, the harmonically distorted waveform is symmetrical about zero amplitude and the cycles can be temporally distinguished by occurrences of amplitudes having absolute values equal to the absolute value (either positive or negative amplitudes) of the trigger amplitude. To avoid false triggering resulting from the localized amplitude dithering, particularly in the vicinity of the expected zero crossing and amplitude peak of the fundamental frequency component of the harmonically distorted reference waveform, the trigger amplitude is set at a level greater than 10% but less than 90% of the maximum amplitude of the fundamental frequency component of the waveform. Typically, an amplitude approximately intermediate between zero and the maximum amplitude of the fundamental frequency component of the distorted waveform, for example 50V for a 120 V circuit, is selected as a trigger amplitude because the resistance to false triggering is greatest and the temporal effects of harmonic distortion are minimized at one-half of the maximum amplitude.

Figure 11:
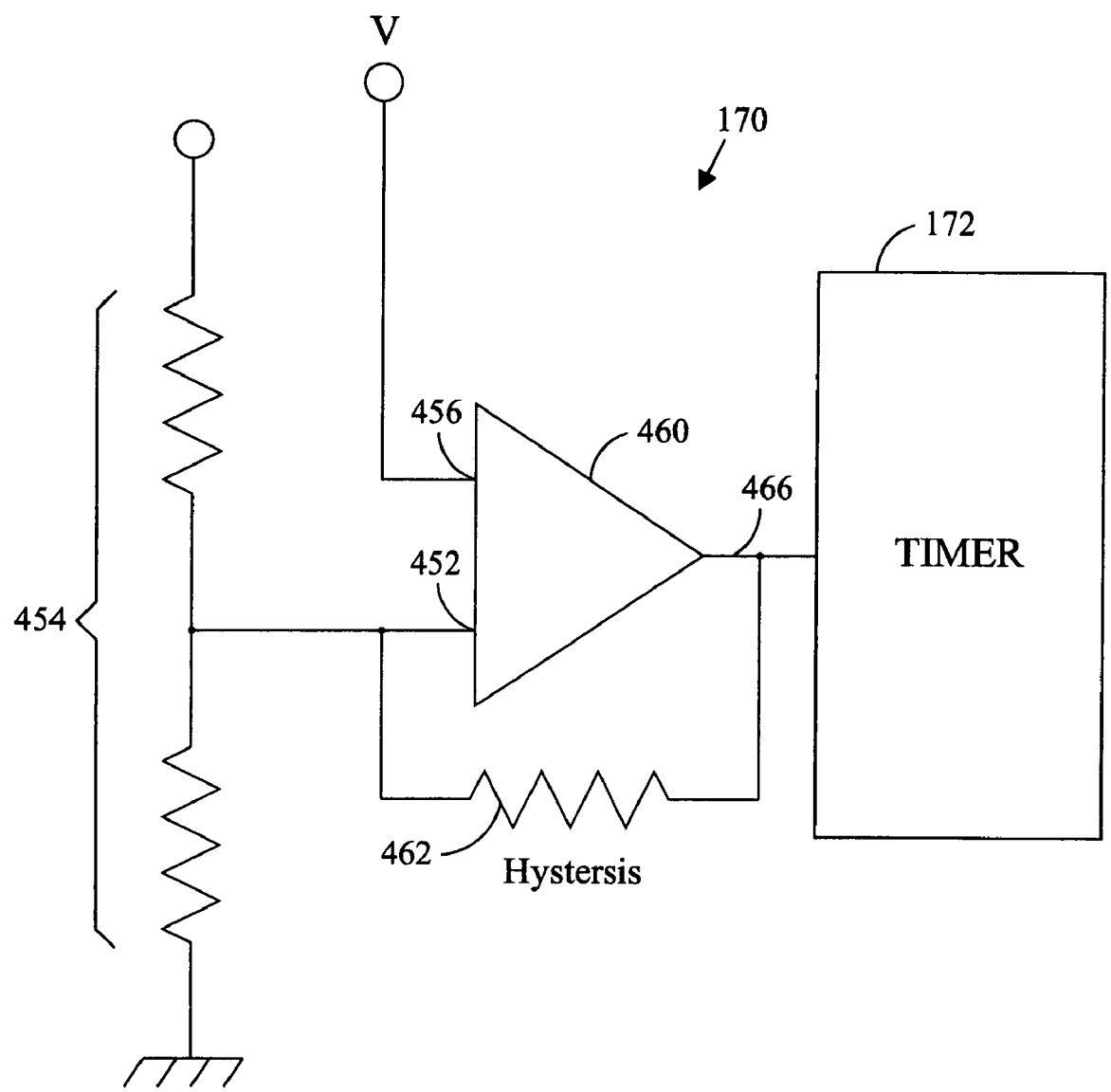
FIG. 11 is a schematic representation of a trigger amplitude detector of the electric power meter of FIG. 3.

In the power meter 100, occurrences of a voltage equal to the trigger voltage 56 are detected by a trigger amplitude detector 170. The trigger amplitude detector 170 initiates operation of a first timer 172 when the absolute value of the instantaneous voltage equals or exceeds the absolute value of the trigger voltage 56 on one edge of the cycle and terminates operation of the first timer when the absolute value of the voltage again drops below the absolute value of the trigger voltage on the opposite edge of the cycle. Referring to FIG. 11, the trigger amplitude detector 170 comprises an operational amplifier 460 having a first input 452 connected to a voltage divider 454 (indicated by a bracket) that is the source of a reference voltage equal to the desired trigger voltage. The second input 456 of the operational amplifier is connected to the supply voltage. The trigger amplitude detector 170 comprises, generally, a comparator having an output 466 connected to the first timer 172. When the supply voltage increases to a level equaling the selected trigger voltage 56 the output of the trigger amplitude detector 170 signals the timer 172 to initiate timing of a first interval. When the voltage decreases to less than the trigger voltage 56, operation of the first timer 172 terminates. The operation of the first timer 172 is also signaled to the meter's data processing device 132. While the supply voltage amplitude sampling used in determining the power could used in temporally distinguishing the cycles of the distorted voltage waveform, the trigger amplitude detector provides additional accuracy without requiring additional data processing resources to interpolate amplitude samples to determine when the voltage equals the trigger voltage. In addition, to reduce the likelihood that the sensed signal oscillates above and below the sample level, some hysteresis may be included in the amplification, such as with a feedback resistor 462, to reduce the effects of the harmonics and noise in the signal.

Referring to FIG. 10, in the power meter 100, the phase angle is determined from the temporal relationship of the peak current 84 and the peak voltage as inferred from the occurrences of instantaneous voltages equal to the trigger voltage 56 on the rising and falling edges of the harmonically distorted voltage cycle. To determine the power flow to the load 104, the data processing system periodically samples the voltage and current from the output of the respective voltage 114 and current 116 transducers. If the amplitude of the current of the present sample ($I_s$) does not exceed the current of the previous sample ($I_{s-1}$) 404, the data processing system determines if the first timer 172 has been started by the trigger amplitude detector 170 to measure the first interval, at step 406. If the first timer 172 has not been started, the voltage has not reached the trigger voltage and the data processing system samples the current again 402 at the appropriate time. If the peak current 84 has not been reached 404, but the first timer has been started 406, operation of a second timer 174 is initiated by the data processing system to measure a second interval.

If the peak current has been reached 404, the operating status of the first timer is also checked 410. If the first timer has not been started, timing is initiated with second timer 412 and a flag is set 414 indicating that the peak amplitude of the current was attained before the voltage had reached the trigger amplitude 56.

If the current has attained its maximum amplitude 404 at the present sample and the first timer has been started 410, the data processing system checks the status of the flag 416. If the flag has been set 416, indicating that operation of the second timer was initiated before operation of the first timer was initiated; the data processing system waits 418 until the trigger amplitude detector 170 terminates operation of the first timer 420 and then terminates operation of the second timer 422. The data processing system then calculates the phase angle from the first and second time intervals 424. Since the second timer was initiated before the voltage reached the trigger voltage 56, the phase is leading and the phase angle equals:

$$\theta = \omega\left(\Delta T_2 - \frac{\Delta T_1}{2}\right) \quad (15)$$

where:
ω=the angular frequency
$\Delta T_2$=second timer interval
$\Delta T_1$=first timer interval On the other hand, if, when sampled 402, the current has attained its maximum amplitude 404 and the first timer has been started 410, but the flag 426 indicates that the operation of the second timer was initiated when the voltage reached the trigger voltage 56 and operation of the first timer was initiated; the second timer is stopped 426. The data processing system waits 430 until the trigger amplitude detector 170 stops the first timer 428 and then calculates the phase 432 from the first and second time intervals. In this case, the phase angle equals:

$$\theta = \omega\left(\frac{\Delta T_1}{2} - \Delta T_2\right) \quad (16)$$

If the second time interval is less than one-half the first time interval, the calculated phase will be positive, indicating a leading phase produced by a capacitive load. If the second timer interval is greater than one-half of the first timer interval, the phase angle will be negative indicating an inductive load.

While the first 172 and second 174 timers are illustrated as discrete devices, the timers can be integral to the data processing device 132 and the memory 138. In addition, at least one of the first timer 172 and the second timer 174 could be implanted as a sample counter because the voltage and current sampling are typically performed synchronously by the data processing device 132 permitting the time intervals to be calculated from sample counts.

The phase determination apparatus and method used in the electric power meter provides an accurate and computationally uncomplicated system for determining the phase angle of a first waveform relative to a harmonically distorted reference waveform.

A power meter incorporating the phase shift detection and current transformer phase adjustment methods of the digital power meter 100 in combination with the use of interrupts performed in anticipation of interrupt latency requires significantly fewer computational resources than digital power meters utilizing dedicated data processing devices for real-time tasks, such as sampling; performing current transformer phase adjustment from the results of individual current samples; and filtering or interpolating to distinguish cycles of distorted waveforms.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A power meter comprising:
   (a) a first sampler responsive to assertion of a first sampling signal to capture an instantaneous value of a signal representing a load voltage;
   (b) a current transducer having an output signal representative of a load current;
   (c) a second sampler responsive to assertion of a second sampling signal to capture an instantaneous value of said output signal of said current transducer; and
   (d) a sampling timer varying an interval between assertion of one of said first sampling signal and said second sampling signal and assertion of the other of said first sampling signal and said second sampling signal, a phase shift between said output signal and said load current determinative of said interval.

2. A power meter comprising:
   (a) a first sampler responsive to a first sampling signal to capture an instantaneous value of a signal representing a load voltage;
   (b) a current transducer having an output signal representative of a load current;
   (c) a second sampler responsive to a second sampling signal to capture an instantaneous value of said output signal of said current transducer; and
   (d) a sampling timer varying an interval between assertion of one of said first sampling signal and said second sampling signal and assertion of the other of said first sampling signal and said second sampling signal, said interval determined by a root mean square of an approximation of said load current.

3. The power meter of claim 2 wherein said approximation of said load current comprises a multiple of an instantaneous value of an output signal of said current transducer.

4. A power meter comprising:
(a) a current transformer including a primary winding and a secondary winding; and
(b) a data processing system
   (i) periodically sampling a current signal representative of a secondary current induced in said secondary winding by a flow of a load current in said primary winding;
   (ii) calculating a root mean square assumed load current from a plurality of earlier samples of said current signal;
   (iii) determining a phase error correction corresponding to said root mean square assumed load current; and
   (iv) calculating a phase adjusted load current corresponding to a later sample of said current signal from a value of said later sample of said current signal and said phase error correction.

5. The power meter of claim 4 wherein said data processing system determines said phase error correction by accessing a memory including a plurality of phase error corrections and a plurality of respectively corresponding root mean square load currents for said current transformer.

6. The power meter of claim 5 wherein said data processing system calculates said phase error correction from an equation relating phase error correction to root mean square current load current.

7. A power meter comprising:
(a) a current transformer including a primary winding and a secondary winding; and
(b) a data processing system
   (i) periodically sampling a current signal representative of a secondary current induced in said secondary winding by a flow of a load current in said primary winding;
   (ii) calculating a root mean square assumed load current from a temporally earlier plurality of samples of said current signal;
   (iii) determining from said root mean square assumed load current a sampling differential interval; and
   (iv) calculating power from a subsequent sample of said current signal and a corresponding sample of a voltage signal, acquisition of said subsequent sample of said current signal being temporally offset by said sampling differential interval from acquisition of said corresponding sample of said voltage signal.

8. The power meter of claim 7 wherein said data processing system determines said sampling differential interval by accessing a memory including a plurality of sampling differential intervals and a plurality of respectively corresponding root mean square load currents for said current transformer.

9. The power meter of claim 7 wherein said data processing system calculates said sampling differential interval from an equation relating sampling differential interval to root mean square current load current.

10. A power meter comprising:
(a) a sampler responsive to assertion of a sampling signal to capture an instantaneous amplitude of an analog signal;
(b) a data processing system reading said instantaneous amplitude of said analog signal in response to execution of a program instruction included in an interrupt service routine, said interrupt service routine being executed in response to an interrupt request and said program instruction being executed subsequent to a period of interrupt latency; and
(c) a sampling timer asserting said interrupt request and said sampling signal, said interrupt request being asserted prior to assertion of said sampling signal.

11. The power meter of claim 10 wherein said interrupt request is asserted prior to assertion of said sampling signal by an interval at least equal to said period of interrupt latency.

12. The power meter of claim 10 wherein said sampling timer comprises a counter incremented by a clock signal and outputting an interrupt request signal to said data processing device upon expiration of an interrupt initiation interval and a sampling signal upon expiration of a sampling interval; expiration of said interrupt initiation signal preceding expiration of said sampling interval by a interval at least equal to said interrupt latency.

13. A power meter comprising a trigger amplitude detector initiating a temporal measurement of a waveform when an amplitude of said waveform corresponds to a trigger amplitude, said trigger amplitude being greater than ten percent of a maximum amplitude of one of said waveform and a fundamental frequency component of said waveform and less than ninety percent of said maximum amplitude of said one of said waveform and said fundamental frequency component.

14. The power meter of claim 13 wherein said trigger amplitude detector terminates said temporal measurement of said waveform when said amplitude no longer exceeds said trigger amplitude.

15. The power meter of claim 13 wherein said trigger amplitude comprises an amplitude greater than twenty percent of said maximum amplitude and less than eighty percent of said maximum amplitude.

16. The power meter of claim 15 wherein said trigger amplitude detector terminates said temporal measurement of said waveform when said amplitude no longer exceeds said trigger amplitude.

17. The power meter of claim 13 wherein said trigger amplitude comprises an amplitude greater than thirty percent of said maximum amplitude and less than seventy percent of said maximum amplitude.

18. The power meter of claim 17 wherein said trigger amplitude detector terminates said temporal measurement of said waveform when said amplitude no longer exceeds said trigger amplitude.

19. The power meter of claim 13 wherein said trigger amplitude comprises an amplitude greater than forty percent of said maximum amplitude and less than sixty percent of said maximum amplitude.

20. The power meter of claim 19 wherein said trigger amplitude detector terminates said temporal measurement of said waveform when said amplitude no longer exceeds said trigger amplitude.

21. A power meter comprising:
(a) a trigger amplitude detector sensing a voltage, said trigger amplitude detector outputting a signal to initiate timing of a first interval when an amplitude of said voltage exceeds a trigger amplitude; and
(b) a data processing system arranged to periodically sample a current and
   (i) initiate timing of a second interval upon an earlier occurrence of initiation of timing of said first interval and detection of a temporally preceding current sample having an amplitude exceeding an amplitude of a present current sample;
   (ii) terminate timing of said second interval upon a temporally later occurrence of detecting a temporally preceding current sample having an amplitude exceeding an amplitude of a present current sample and terminating timing of said first interval, timing of said first interval being terminated by detection of an amplitude of said voltage less than said trigger amplitude;

(iii) calculate a relative phase of a load voltage and a load current from said first and said second intervals.

22. The power meter of claim 21 wherein said trigger amplitude comprises an amplitude greater than ten percent of a maximum amplitude of one of said load voltage and a fundamental frequency component of said load voltage and less than ninety percent of said maximum amplitude of said one of said load voltage and said fundamental frequency component of said load voltage.

23. The power meter of claim 21 wherein said trigger amplitude comprises an amplitude greater than twenty percent of a maximum amplitude of one of said load voltage and a fundamental frequency component of said load voltage and less than eighty percent of said maximum amplitude of said one of said load voltage and said fundamental frequency component of said load voltage.

24. The power meter of claim 21 wherein said trigger amplitude comprises an amplitude greater than thirty percent of a maximum amplitude of one of said load voltage and a fundamental frequency component of said load voltage and less than sixty percent of said maximum amplitude of said one of said load voltage and said fundamental frequency component of said load voltage.

25. The power meter of claim 21 wherein said trigger amplitude detector comprises a voltage comparator arranged to compare an amplitude of a load voltage to a reference voltage having an amplitude substantially equal to said trigger amplitude.

26. The power meter of claim 21 wherein said trigger amplitude detector comprises an operational amplifier having a first input connected to a source of a voltage signal representative of a said load voltage and a second input connected to source of a reference voltage having an amplitude substantially equal to said trigger amplitude.

27. The power meter of claim 26 wherein said trigger amplitude detector further comprises a feedback resistor connecting an output of said operational amplifier and said first input.

28. The power meter of claim 26 further comprising a timer responsive to an output of said operational amplifier to initiate timing of said first interval.

29. A power meter comprising:
(a) a first sampler responsive to assertion of a first sampling signal to capture an instantaneous value of a voltage signal representing a load voltage;
(b) a current transducer outputting a current signal representative of a load current;
(c) a second sampler responsive to assertion of a second sampling signal to capture an instantaneous value of said current signal;
(d) a sampling timer periodically asserting said first sampling signal and periodically asserting a second sampling signal, assertion of said first sampling signal being temporally offset from assertion of said second sampling signal by a sampling differential interval;
(e) a trigger amplitude detector sensing a voltage, said trigger amplitude detector outputting a signal to initiate timing of a first interval when said voltage exceeds a trigger voltage and terminate timing of said first interval when said voltage does not exceed said trigger voltage;
(f) a data processing system
(i) calculating a root mean square assumed load current from a temporally earlier plurality of samples of said current signal;
(ii) determining from said root mean square assumed load current a sampling differential interval for a temporally later assertion of said first sampling signal and said second sampling signal;
(iii) initiating timing of a second interval upon a temporally earlier occurrence of initiation of said timing of said first interval and detection of a temporally preceding current sample having an amplitude exceeding an amplitude of a present current sample;
(iv) terminating timing of said second interval upon a temporally later occurrence of detection of a temporally preceding current sample having an amplitude exceeding an amplitude of a present current sample and termination of said timing of said first interval;
(v) calculating a relative phase of a load voltage and a load current from said first and said second intervals; and
(vi) calculating power from a sample of said current signal and a sample of said voltage signal.

30. The power meter of claim 29 wherein said data processing system includes a program instruction to be executed at a real execution time, said program instruction included in an interrupt service routine and executable after a period of interrupt latency, said interrupt service routine being executed in response to an interrupt request asserted prior to said real execution time by an interval at least equal to said period of interrupt latency.

31. A data processing system including a program instruction to be executed at a real execution time, said program instruction included in an interrupt service routine and executable after a period of interrupt latency, said interrupt service routine being executed in response to an interrupt request asserted prior to said real execution time by an interval at least equal to said period of interrupt latency.

32. A method of operating a data processing system comprising the steps of:
(a) executing an interrupt service routine in response to an interrupt request, said interrupt service routine including a program instruction executable after a period of interrupt latency, said program instruction to be executed at a real execution time; and
(b) asserting said interrupt request at a time preceding said real execution time of said program instruction by an interval at least equal to said period of interrupt latency.

33. A method of measuring power comprising the steps of:
(a) sampling a voltage transducer signal representing a load voltage in response to assertion of a first sampling signal;
(b) sampling a current transducer signal representing a load current in response to assertion of a second sampling signal; and
(c) temporally offsetting assertion of said first sampling signal and assertion of said second sampling signal by a sampling differential interval determined by a magnitude of an assumed root mean square load current.

34. The method of measuring power of claim 33 wherein the step of temporally offsetting assertion of said first sampling signal and assertion of said second sampling signal by an interval determined by a magnitude of an assumed root mean square load current comprises the steps of:
(a) calculating a previous root mean square assumed load current for a plurality of temporally preceding samples of said current transducer signal; and
(b) identifying a sampling differential interval for a present current sample, said sampling differential interval correlated to said previous assumed root mean square load current.

* * * * *

UNITED STATES PATENT AND TRADEMARK OFFICE
CERTIFICATE OF CORRECTION

PATENT NO. : 7,447,603 B2  
APPLICATION NO. : 11/298205  
DATED : November 4, 2008  
INVENTOR(S) : David Bruno It is certified that error appears in the above-identified patent and that said Letters Patent is hereby corrected as shown below:

Col. 2, Line 4

Change: "$(v(t)i(t)dt$" to read: --$(v(t)i(t))dt$--.

Signed and Sealed this  
Twenty-first Day of February, 2012

David J. Kappos  
*Director of the United States Patent and Trademark Office*